United States Patent
Lin et al.

(10) Patent No.: US 7,936,555 B2
(45) Date of Patent: May 3, 2011

(54) METHOD FOR FABRICATING FLEXIBLE SUPER CAPACITOR

(75) Inventors: Wen-Ting Lin, Caotun Township (TW); Hung-Chang Chen, Tu-Chen (TW); Jui-Kai Hu, Kaohsiung (TW); Nae-Lih Wu, Tu-Chen (TW)

(73) Assignee: Taiwan Textile Research Institute, Taipei Hsien (TW)

( * ) Notice: Subject to any disclaimer, the term of this patent is extended or adjusted under 35 U.S.C. 154(b) by 684 days.

(21) Appl. No.: 11/961,569

(22) Filed: Dec. 20, 2007

(65) Prior Publication Data

US 2008/0158779 A1    Jul. 3, 2008

(30) Foreign Application Priority Data

Dec. 22, 2006 (TW) .............................. 95148602 A

(51) Int. Cl.
*H01G 9/00* (2006.01)
(52) U.S. Cl. ........ 361/502; 361/503; 361/504; 361/512; 361/516; 361/523; 257/295; 257/296
(58) Field of Classification Search .................. 361/502, 361/503–504, 512, 516–519, 523–525; 257/295, 257/296; 438/238, 239
See application file for complete search history.

(56) References Cited

U.S. PATENT DOCUMENTS

| 4,562,511 | A | * | 12/1985 | Nishino et al. | ................ | 361/324 |
| 4,597,028 | A | * | 6/1986 | Yoshida et al. | ............... | 361/305 |
| 5,776,633 | A | * | 7/1998 | Mrotek et al. | ............. | 429/231.8 |
| 6,585,152 | B2 | * | 7/2003 | Farahmandi et al. | ......... | 228/262 |
| 6,643,119 | B2 | * | 11/2003 | Nanjundiah et al. | .......... | 361/502 |
| 7,026,793 | B2 | * | 4/2006 | Park | ............................ | 320/167 |
| 7,438,622 | B2 | * | 10/2008 | Ra et al. | .......................... | 445/51 |

* cited by examiner

*Primary Examiner* — Nguyen T Ha
(74) *Attorney, Agent, or Firm* — Occhiuti Rohlicek & Tsao LLP

(57) ABSTRACT

A flexible super capacitor including a pair of flexible electrodes and a separator film is disclosed. Each flexible electrode includes a carbon fiber layer and a collector formed on a surface of the carbon fiber layer. The pair of flexible electrodes has two outer surfaces, and the collector layers are formed on the outer surfaces of the pair of the flexible electrodes. The separator film is disposed between the flexible electrodes. The collector layer would be formed on the carbon fiber layer with surface metalizing the carbon fiber layer. A method for fabricating the flexible electrode of the flexible super capacitor is also disclosed.

9 Claims, 3 Drawing Sheets

US 7,936,555 B2

METHOD FOR FABRICATING FLEXIBLE SUPER CAPACITOR

RELATED APPLICATIONS

This application claims priority to Taiwan Application Serial Number 95148602, filed Dec. 22, 2006, which is herein incorporated by reference.

BACKGROUND

1. Field of Invention

The present invention relates to a super capacitor. More particularly, the present invention relates to a flexible super capacitor and an electrode thereof.

2. Description of Related Art

With rapid development of costumer electronic products, the requirement of a capacitor with high stability, large capacitance, and long life has increased. Thus, a super capacitor has been developed. The super capacitor has two electrodes and an electrolyte poured between the electrodes. The ions in the electrolyte would be separated and absorbed on the electrodes with opposite electricity to accumulate the electricity.

The traditional method for fabricating the super capacitor may be gluing the carbon powder on a collector layer of the electrode. However, the flexibility and the capacitance of the super capacitor would be reduced and the internal resistance would be increased caused by the binder between the carbon powder and the collector layer.

SUMMARY

The invention provides a flexible super capacitor including a pair of flexible electrodes and a separator film. Each flexible electrode includes a carbon fiber layer and a collector formed on a surface of the carbon fiber layer. The pair of flexible electrodes has two outer surfaces, and the collector layers are formed on the outer surfaces of the pair of the flexible electrodes. The separator film is disposed between the flexible electrodes.

The invention also provides a method for fabricating the flexible electrode of the flexible super capacitor. The method includes proving a carbon fiber layer; surface metalizing the carbon fiber layer to form a collector layer on the surface of the carbon fiber layer.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
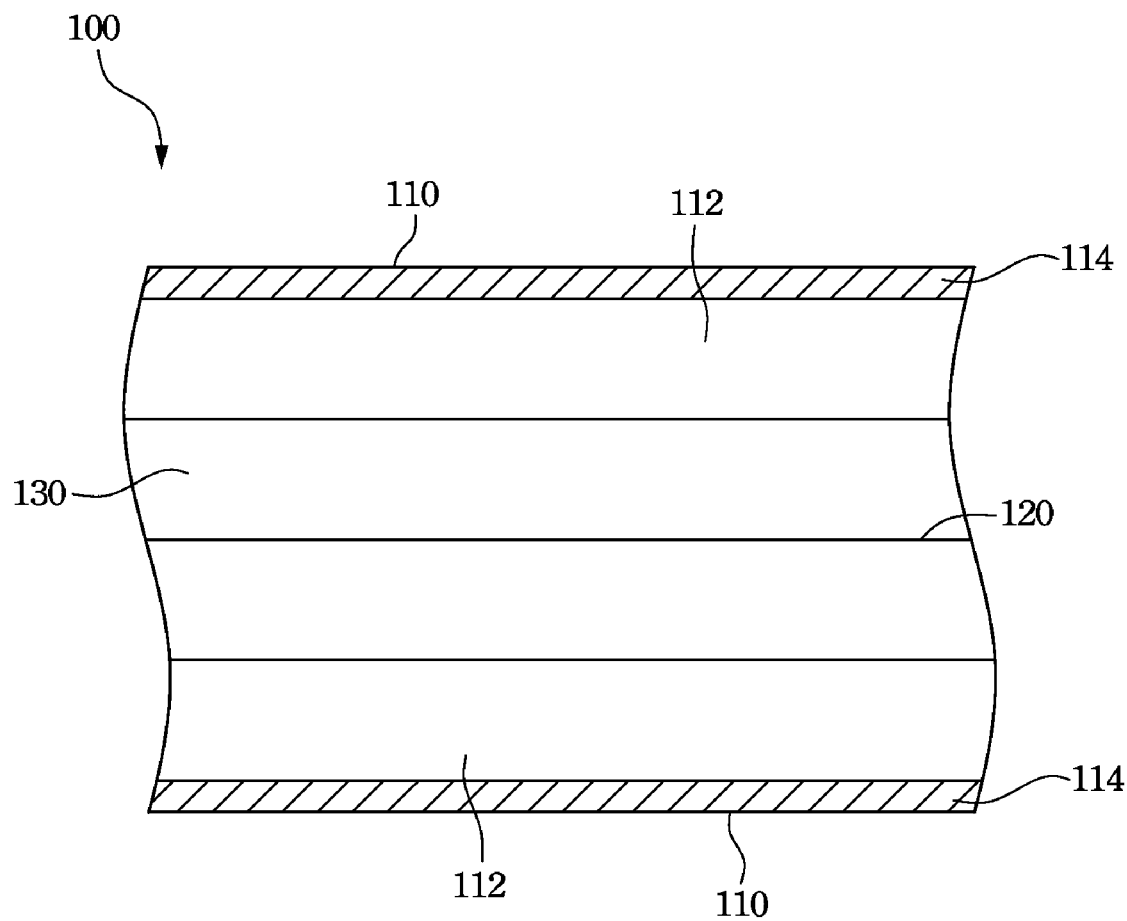
FIG. 1 is a schematic diagram of an embodiment of the flexible super capacitor of the invention.

Reference will now be made in detail to the present preferred embodiments of the invention, examples of which are illustrated in the accompanying drawings. Wherever possible, the same reference numbers are used in the drawings and the description to refer to the same or like parts.

Refer to FIG. 1. FIG. 1 illustrates a schematic diagram of an embodiment of the flexible super capacitor of the invention. The flexible super capacitor 100 includes a pair of flexible electrodes 110, a separator film 120 disposed between the flexible electrodes 110, and an electrolyte 130 poured between the flexible electrodes 110. Each flexible electrode 110 has a carbon fiber layer 112 and a collector layer 114. The collector layer 114 is formed on the carbon fiber layer 112 directly with a surface modification process, such as sputtering. The pair of flexible electrodes 110 has two outer surfaces, and the collector layers 114 are formed on the outer surfaces of the pair of the flexible electrodes 110.

The thickness of the collector layer 114 could be adjusted by the control parameters during sputtering. The preferred thickness of the collector layer 114 is 0.01 μm to 20 μm. The preferred specific surface of the carbon fiber layer 112 is 700 $m^2/g$ to 2000 $m^2/g$. The preferred hole size of the carbon fiber layer 112 is 2 nm to 50 nm. The hole ratio of the carbon fiber layer 112 could be increased by surface modifying the carbon fiber layer 112, such as steaming the carbon fiber layer 112. The material of the collector layer 114 may be a high activity metal. For example, the metal material of the collector layer 114 may be selected from a group consisting of platinum, titanium, gold, silver, copper, aluminum, chromium, iron, and the combination.

The flexible super capacitor 100 may further include a sealing film (not shown) for sealing the electrolyte 130. The material of the sealing film may be a plastic or an aluminum foil. The electrolyte 130 poured between the flexible electrodes 110 may be an aqueous electrolyte or an organic electrolyte. The surface of the carbon fiber layer 112 may be an activated surface, and the electrolyte 130 may be an organic electrolyte. In another embodiment, the surface of the carbon fiber layer 112 may be an inactivated surface, and the electrolyte 130 may be an aqueous electrolyte. The organic electrolyte may also be utilized with the activated surface of the carbon fiber layer 112, and the aqueous electrolyte may be utilized with the inactivated surface of the carbon fiber layer 112.

The ions with opposite electricity in the electrolyte 130 would be separated and be absorbed on the respective flexible electrodes 110 to accumulate electric charges on the collector layer 114 when a voltage is applied for the flexible electrode 110. The collector layer 114 in this embodiment is formed on the carbon fiber layer 112 directly with surface metalizing modifying the carbon fiber layer 112. Comparing with a traditional flexible electrode, which may have carbon powder glued on the collector layer, the carbon fiber layer 112 in this invention may have higher carbon content and larger specific surface, thus the capacitance of the flexible super capacitor 100 in this invention would be highly increased.

Figure 2A:
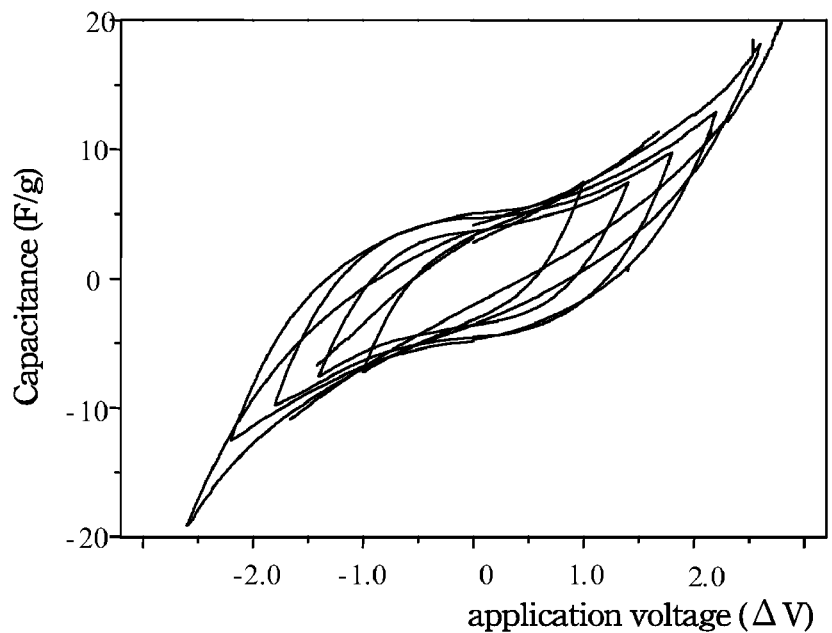
FIG. 2A is a capacitance graph of a traditional super capacitor.
Figure 2B:
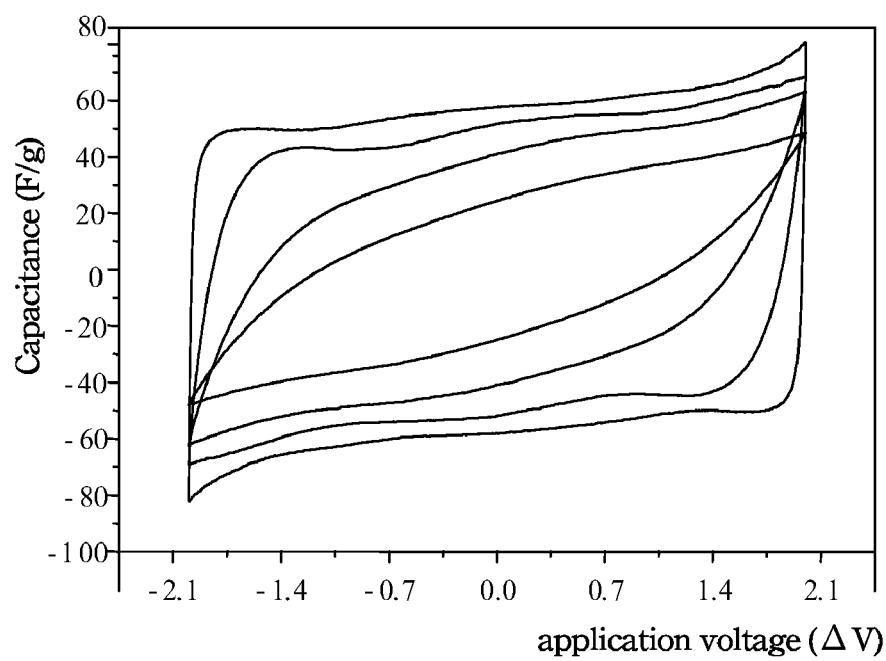
FIG. 2B is a capacitance graph of an embodiment of the flexible super capacitor of the invention.

Refer to FIG. 2A and FIG. 2B. FIG. 2A illustrates a capacitance graph of a traditional super capacitor. FIG. 2B Illustrates a capacitance graph of an embodiment of the flexible super capacitor of the invention. The electrode of the traditional super capacitor in FIG. 2A is made of a titanium collector layer and a carbon fiber layer glued on the titanium collector layer with a silver binder. The electrode of the flexible super capacitor of the invention in FIG. 2B has a platinum collector layer sputtered on the carbon fiber layer, thus the flexibility and the capacitance of the flexible super capacitor would not be reduced by the silver binder.

The capacitance graph in FIG. 2A and FIG. 2B is illustrated with cyclic voltammetry (CV) scanning the traditional flexible super capacitor and the present flexible super capacitor respectively. The capacitance of the traditional flexible super capacitor under the CV scanning is approximately to 10 F/g when the application voltage between +2~−2 voltage is applied. The capacitance of the present flexible super capacitor in this invention under the CV scanning is approximately to 60 F/g when the application voltage between +2~−2 voltage is applied.

Figure 3:
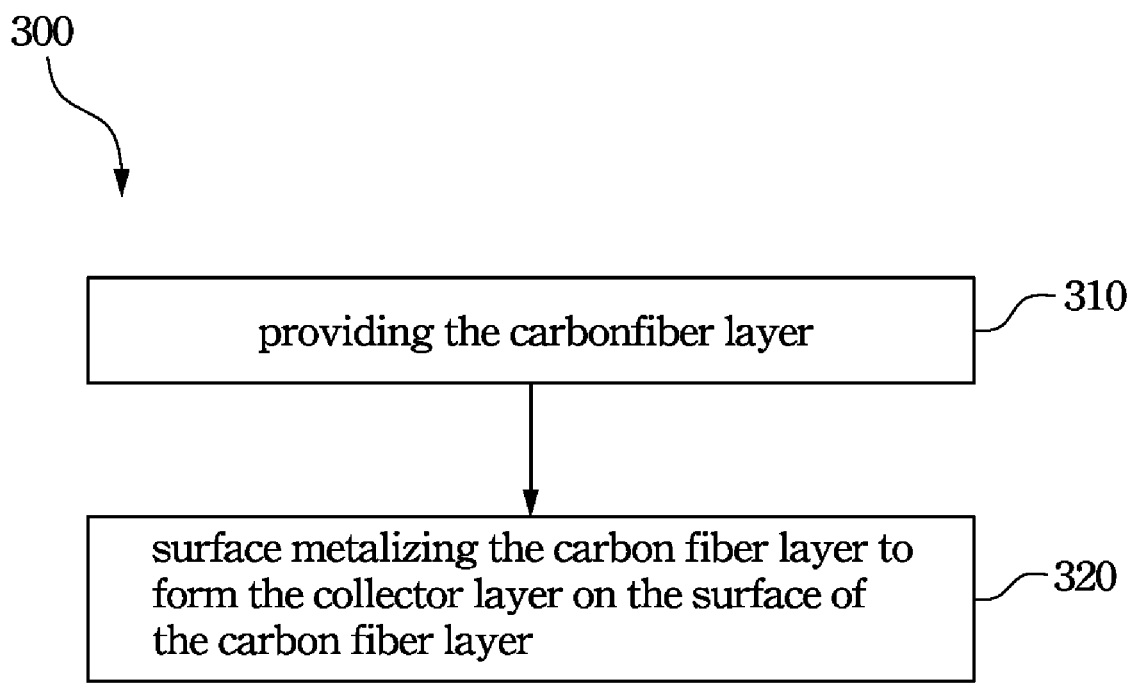
FIG. 3 is a flow chart of an embodiment of the method for fabricating the electrode of the flexible super capacitor of the invention.

Refer to FIG. 1 and FIG. 3 simultaneously. FIG. 3 illustrates a flow chart of an embodiment of a method for fabricating the flexible electrode of the flexible super capacitor of the invention. The method 300 for fabricating the flexible electrode 110 begins at step 310, which is providing the carbon fiber layer 112. Then, step 320 is surface metalizing the carbon fiber layer 112 to form the collector layer 114 on the carbon fiber layer 112. Step 320 may be sputtering the metal material on the surface of the carbon fiber layer 112. The sputtering process may be a roll-to-roll sputtering process to sputter the metal material on the rolling carbon fiber layer 112. The carbon fiber layer 112 may be a sputter film, and the metal material to form the collector layer 114 may be a sputter target of the sputter process. The rolling speed of the carbon fiber layer 112 may be 0.1~0.3 cm/s. The distance between the metal target and the carbon fiber layer 112 may be 80 mm to 120 mm. The metal material of the sputter target to form the collector layer 114 may be selected from a group consisting of platinum, titanium, gold, silver, copper, aluminum, chromium, iron, and the combination. The sputter time may be 10 minutes to 40 minutes. The sputter pressure during the sputtering process may be 2~20 millitorr. The sputter power during the sputtering process may be 100~400 watts. The method 300 may further include surface activating the carbon fiber layer 112.

According to the present invention, the collector layer may be formed on the carbon fiber layer directly with surface metalizing the carbon fiber layer of the flexible electrode, but not being glued on the flexible electrode. The flexibility of the flexible super capacitor of the invention would be increased, and the internal resistance of the flexible electrode would be reduced by omitting the binder. The carbon content and the specific surface of the carbon fiber is higher than the carbon content and the specific surface of the carbon powder, thus the capacitance of the flexible super capacitor of the invention would be highly increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a flexible electrode of a super capacitor, the method comprising:
   providing a carbon fiber layer; and
   surface metalizing the carbon fiber layer to form a collector layer on a surface of the carbon fiber layer, wherein surface metalizing the carbon fiber layer is sputtering a metal material on the surface of the carbon fiber layer.

2. The method for fabricating a flexible electrode of a super capacitor of claim 1, wherein the carbon fiber layer is a sputter film, and the metal material is a sputter target.

3. The method for fabricating a flexible electrode of a super capacitor of claim 2, wherein a rolling speed of the carbon fiber layer is 0.1~0.3 cm/s.

4. The method for fabricating a flexible electrode of a super capacitor of claim 1, wherein a distance between the sputter film and the sputter target is 80~120 mm.

5. The method for fabricating a flexible electrode of a super capacitor of claim 1, wherein a sputter pressure during sputtering is 2~20 millitorr.

6. The method for fabricating a flexible electrode of a super capacitor of claim 1, wherein a sputter power during sputtering is 100~400 watts.

7. The method for fabricating a flexible electrode of a super capacitor of claim 1, wherein the metal material is selected from a group consisting of platinum, titanium, gold, silver, copper, aluminum, chromium, iron, and the combination.

8. The method for fabricating a flexible electrode of a super capacitor of claim 1, wherein a thickness of the collector layer is 0.01 μm to 20 μm.

9. The method for fabricating a flexible electrode of a super capacitor of claim 1, further comprising surface activating the carbon fiber layer.

* * * * *